US010014400B2

(12) United States Patent
Oefner et al.

(10) Patent No.: US 10,014,400 B2
(45) Date of Patent: Jul. 3, 2018

(54) SEMICONDUCTOR DEVICE HAVING A DEFINED OXYGEN CONCENTRATION

(71) Applicant: Infineon Technologies AG, Neubiberg (DE)

(72) Inventors: Helmut Oefner, Zorneding (DE); Nico Caspary, Munich (DE); Mohammad Momeni, Villach (AT); Reinhard Ploss, Unterhaching (DE); Francisco Javier Santos Rodriguez, Villach (AT); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/650,504

(22) Filed: Jul. 14, 2017

(65) Prior Publication Data

US 2017/0316929 A1    Nov. 2, 2017

Related U.S. Application Data

(62) Division of application No. 14/867,839, filed on Sep. 28, 2015, now Pat. No. 9,728,395.

(30) Foreign Application Priority Data

Oct. 9, 2014    (DE) ..................... 10 2014 114 683

(51) Int. Cl.
*H01L 29/739*    (2006.01)
*H01L 21/02*    (2006.01)
(Continued)

(52) U.S. Cl.
CPC ...... *H01L 29/7393* (2013.01); *H01L 21/0201* (2013.01); *H01L 21/02002* (2013.01);
(Continued)

(58) Field of Classification Search
CPC ......... H01L 21/02002; H01L 21/02005; H01L 21/02008; H01L 21/0201; H01L 21/02013;
(Continued)

(56) References Cited

U.S. PATENT DOCUMENTS

2003/0192469 A1    10/2003    Libbert et al.
2008/0299742 A1    12/2008    Akiyama et al.
(Continued)

FOREIGN PATENT DOCUMENTS

JP        H01259539 A    10/1989
JP        H0878646 A     3/1996
(Continued)

*Primary Examiner* — Eduardo A Rodela
(74) *Attorney, Agent, or Firm* — Murphy, Bilak & Homiller, PLLC

(57) ABSTRACT

A semiconductor device includes: a semiconductor substrate having a first side, a second side opposite the first side, and a thickness; at least one semiconductor component integrated in the semiconductor substrate; a first metallization at the first side of the semiconductor substrate; and a second metallization at the second side of the semiconductor substrate. The semiconductor substrate has an oxygen concentration along a thickness line of the semiconductor substrate which has a global maximum at a position of 20% to 80% of the thickness relative to the first side. The global maximum is at least 2-times larger than the oxygen concentrations at each of the first side and the second side of the semiconductor substrate.

20 Claims, 10 Drawing Sheets

(51) Int. Cl.
*H01L 29/66* (2006.01)
*H01L 21/324* (2006.01)
*H01L 21/268* (2006.01)
*H01L 29/10* (2006.01)
*H01L 21/18* (2006.01)
*H01L 21/322* (2006.01)
*H01L 21/28* (2006.01)
*H01L 21/225* (2006.01)

(52) U.S. Cl.
CPC .. *H01L 21/02005* (2013.01); *H01L 21/02008* (2013.01); *H01L 21/02016* (2013.01); *H01L 21/268* (2013.01); *H01L 21/324* (2013.01); *H01L 21/3225* (2013.01); *H01L 29/1095* (2013.01); *H01L 29/66325* (2013.01); *H01L 29/66348* (2013.01); *H01L 29/7395* (2013.01); *H01L 29/7397* (2013.01); *H01L 21/187* (2013.01); *H01L 21/2257* (2013.01); *H01L 21/28238* (2013.01); *H01L 21/3221* (2013.01); *H01L 21/3242* (2013.01)

(58) Field of Classification Search
CPC ........... H01L 21/02016; H01L 21/3225; H01L 29/1095; H01L 29/66325; H01L 29/7393; H01L 29/7395; H01L 29/7397
See application file for complete search history.

(56) References Cited

U.S. PATENT DOCUMENTS

| | | | |
|---|---|---|---|
| 2009/0007839 A1* | 1/2009 | Ebara | C30B 15/04 |
| | | | 117/2 |
| 2010/0052103 A1 | 3/2010 | Umeno et al. | |
| 2011/0024791 A1 | 2/2011 | Schulze et al. | |
| 2013/0221433 A1 | 8/2013 | Molin et al. | |

FOREIGN PATENT DOCUMENTS

| | | |
|---|---|---|
| JP | H11278983 A | 10/1999 |
| JP | 2004537161 A | 12/2004 |
| JP | 2007311672 A | 11/2007 |
| JP | 2008300571 A | 12/2008 |
| JP | 2009524227 A1 | 6/2009 |
| JP | 2011049384 A | 3/2011 |
| JP | 2012019048 A | 1/2012 |
| JP | 2013010678 A | 1/2013 |
| JP | 2014507366 A | 3/2014 |

\* cited by examiner

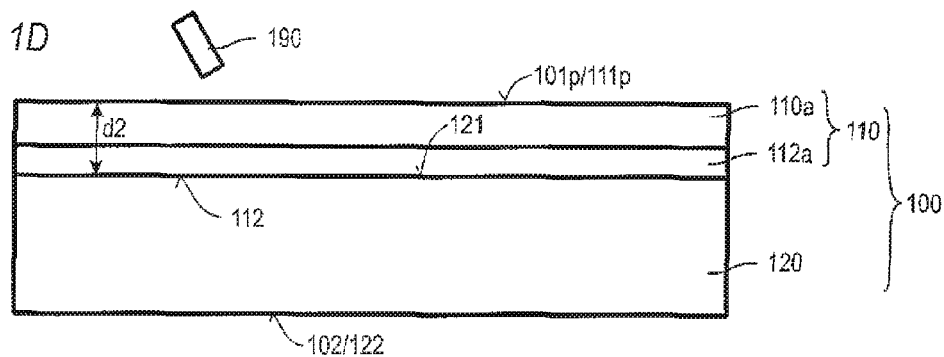
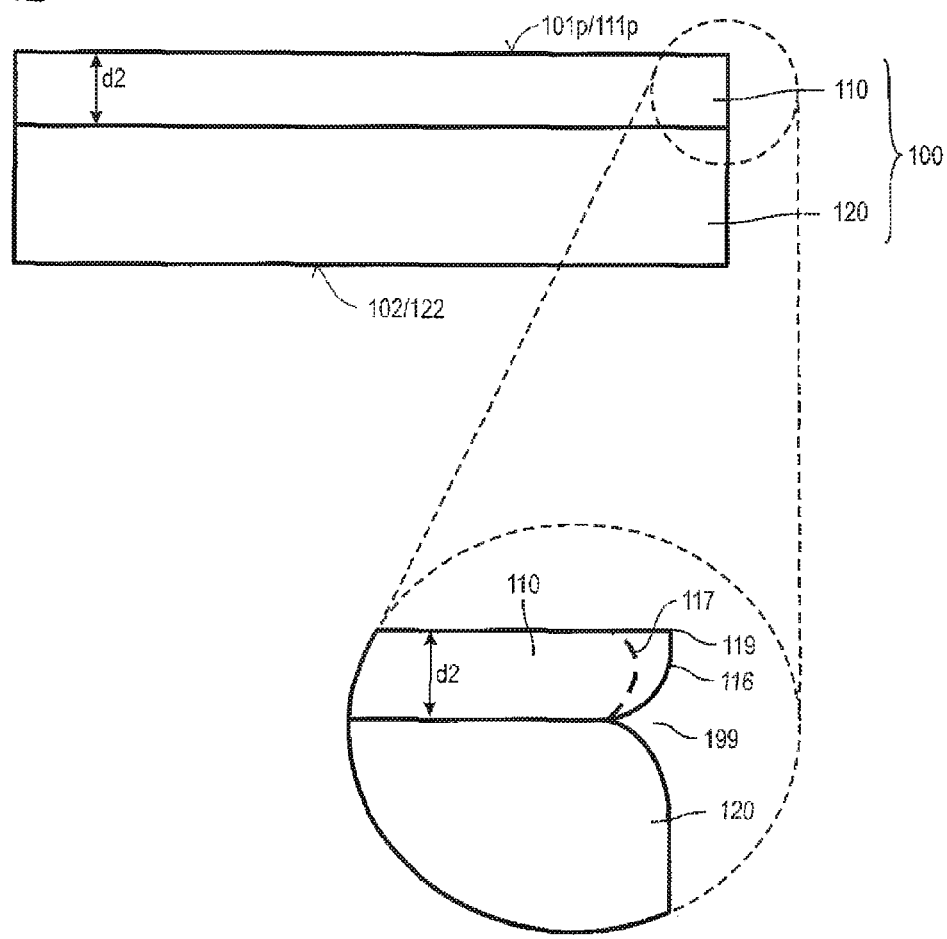

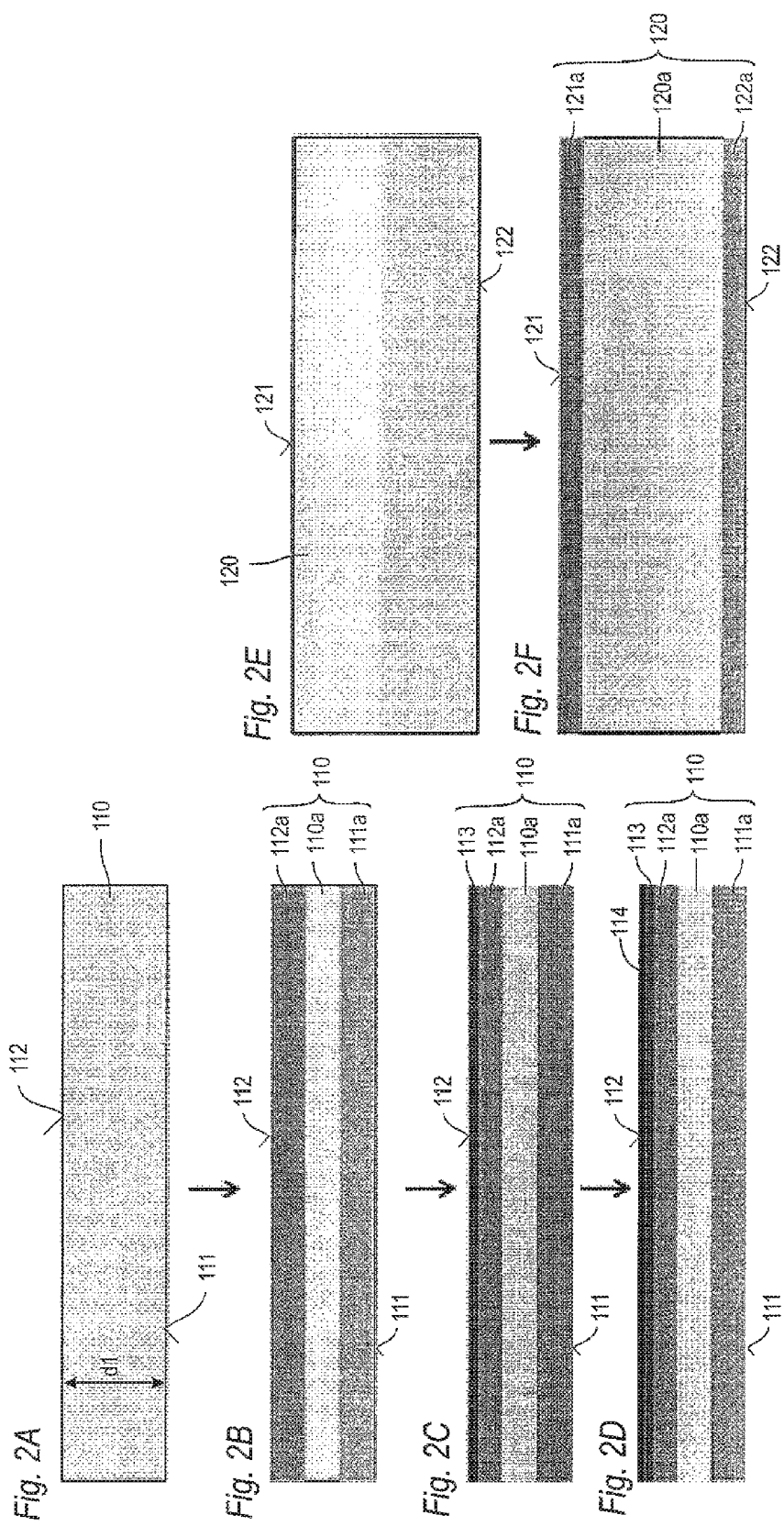

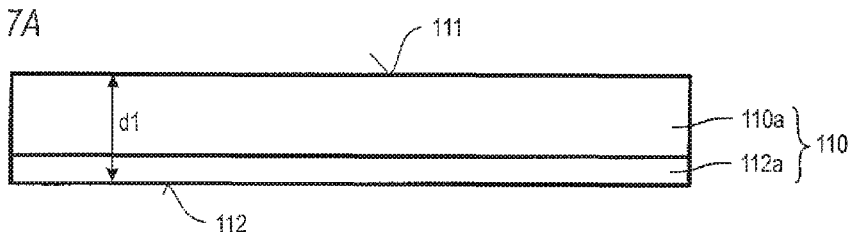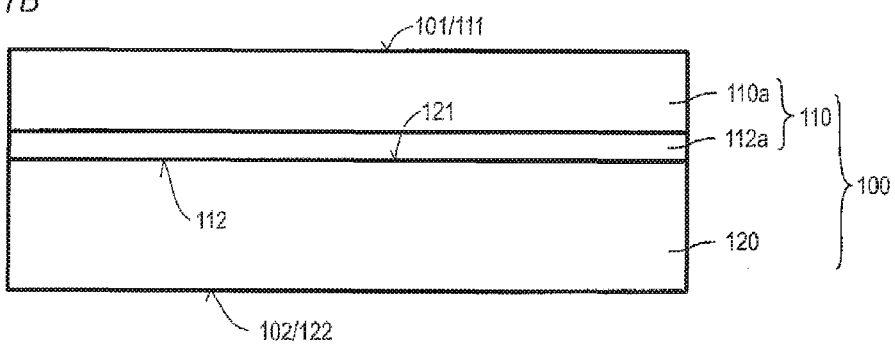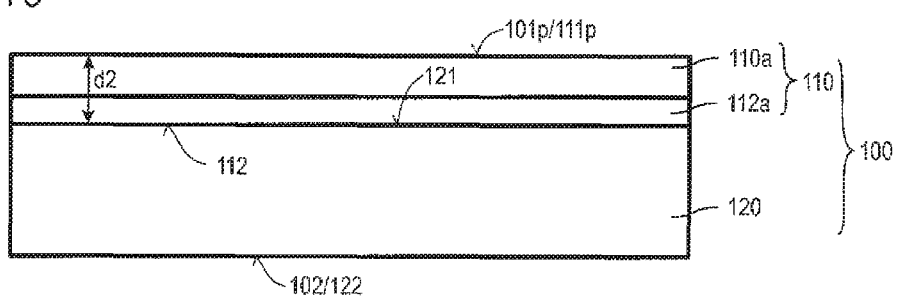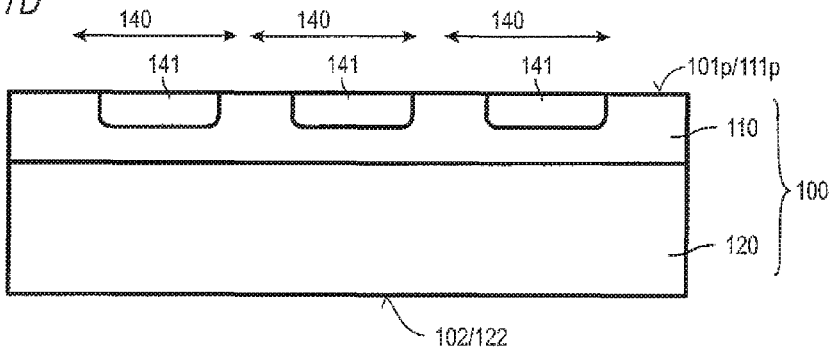

SEMICONDUCTOR DEVICE HAVING A DEFINED OXYGEN CONCENTRATION

BACKGROUND

The present application claims priority under 35 USC § 120 to U.S. patent application Ser. No. 14/867,839 filed on Sep. 28, 2015, and under 35 USC § 119 to German (DE) Patent Application Serial No. DE 10 2014 114 683.2 filed on Oct. 9, 2014. The disclosure in each of these priority applications is hereby incorporated fully by reference into the present application.

TECHNICAL FIELD

Embodiments described herein relate to methods for manufacturing semiconductor wafers, and to semiconductor devices having a low concentration of interstitial oxygen. Further embodiments relates to methods for manufacturing semiconductor wafers having a resistivity in a given range.

BACKGROUND ART

Semiconductor devices are processed on semiconductor wafers which are thin plates of cut large semiconductor crystals, which are referred to as ingots. There are basically two different methods to produce semiconductor ingots: methods based on Czochralski process (CZ process) and methods based on the float-zone process (FZ process). The FZ process allows manufacturing of ingots with a very low concentration of light impurities. However, the size of the ingots which can be produced by FZ processes is limited to about 200 mm in diameter. Furthermore, FZ processes are more expensive than CZ processes. Different to FZ processes, ingots having a large diameter of 300 mm (12 inch) or larger can be manufactured by CZ processes.

For certain devices such as IGBTs a low concentration of interstitial oxygen and a high intrinsic resistivity in a given range are desirable. FZ processes allow the manufacturing of ingots having a sufficiently low concentration of interstitial oxygen at high cost. The concentration of oxygen in CZ crystals is inherently higher than for FZ crystals since a quartz crucible is in direct contact with the hot melt which adds oxygen to the melt. To adjust the resistivity of CZ ingots, dopants can be added to the molten semiconductor material. However, due the segregation effect, the dopants are enriched in the molten semiconductor material during formation of the ingot. The manufactured CZ ingot thus has a doping gradient in its longitudinal direction of 50% or more. Such a variation is too large for many semiconductor devices, particularly power devices, so that a large portion of the ingots cannot be used for the intended purpose. This further increases the manufacturing costs.

In view of the above, there is a need for improvement.

SUMMARY

According to an embodiment, a method for manufacturing a substrate wafer includes: providing a device wafer having a first side and a second side opposite the first side, the device wafer being made of a semiconductor material and having a first thickness; subjecting the device wafer to a first high temperature process for reducing the oxygen content of the device wafer at least in a region at the second side; bonding the second side of the device wafer to a first side of a carrier wafer to form a substrate wafer comprising the device wafer bonded to the carrier wafer, the carrier wafer having a second side opposite the first side which second side of the carrier wafer forms the second side of the substrate wafer, wherein the first side of the device wafer forms a first side of the substrate wafer; processing the first side of the substrate wafer, which is formed by the first side of the device wafer, to reduce the thickness of the device wafer to a second thickness which is less than the first thickness of the device wafer; subjecting the substrate wafer to a second high temperature process for reducing the oxygen content at least of the device wafer bonded to the carrier wafer; and at least partially integrating at least one semiconductor component into the device wafer after the second high temperature process.

According to an embodiment, a method for manufacturing a substrate wafer includes: determining the oxygen concentration distribution of one or more monocrystalline ingots of a semiconductor material, wherein the ingot is particularly a CZ ingot or an MCZ ingot; selecting at least a first region of the one or more monocrystalline ingots having an oxygen concentration which is below a given oxygen threshold; selecting at least a second region of the one or more monocrystalline ingots having an oxygen concentration which is above the given threshold; slicing the first region to form at least a first semiconductor wafer; slicing the second region to form at least a second semiconductor wafer; bonding the first semiconductor wafer to the second semiconductor wafer.

According to an embodiment, a method for manufacturing a substrate wafer includes: determining the resistivity distribution of one or more monocrystalline ingots of a semiconductor material, wherein the ingot is particularly a CZ ingot or an MCZ ingot; selecting at least a first region of the one or more monocrystalline ingots having a resistivity within a given resistivity range; selecting at least a second region of the one or more monocrystalline ingots having a resistivity outside a given resistivity range; slicing the first region to form at least a first semiconductor wafer; slicing the second region to form at least a second semiconductor wafer; bonding the first semiconductor wafer to the second semiconductor wafer.

According to an embodiment, a semiconductor device includes a semiconductor substrate, particularly a monocrystalline silicon substrate, having a first side, a second side opposite the first side, and a thickness. The semiconductor device further includes at least one semiconductor component integrated in the semiconductor substrate, a first metallization at the first side of the semiconductor substrate, and a second metallization at the second side of the semiconductor substrate. The semiconductor substrate has an oxygen concentration along a thickness line of the semiconductor substrate which has a global maximum at a position of 20% to 80% of the thickness relative to the first side, wherein the global maximum is at least 2-times larger, particularly at least 5-times larger, than the oxygen concentrations at each of the first side and the second side of the semiconductor substrate.

Those skilled in the art will recognise additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference signs designate corresponding parts. In the drawings:

FIGS. 1A to 1G illustrate processes of a method for manufacturing a substrate wafer according to an embodiment;

FIGS. 2A to 2J illustrate processes of a method for manufacturing a substrate wafer according to an embodiment;

FIGS. 7A to 7D illustrate processes of a method for manufacturing a substrate wafer according to an embodiment.

DETAILED DESCRIPTION

In the following detailed description, reference is made to the accompanying drawings, which form a part hereof, and in which are shown by way of illustration specific embodiments in which the invention may be practiced. In this regard, directional terminology, such as "top", "bottom", "front", "back", "leading", "trailing", "lateral", "vertical" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

In this specification, a second surface of a semiconductor substrate is considered to be formed by the lower or backside surface while a first surface is considered to be formed by the upper, front or main surface of the semiconductor substrate. The terms "above" and "below" as used in this specification therefore describe a relative location of a structural feature to another structural feature with consideration of this orientation.

The terms "electrical connection" and "electrically connected" describes an ohmic connection between two elements.

Figure 1A:
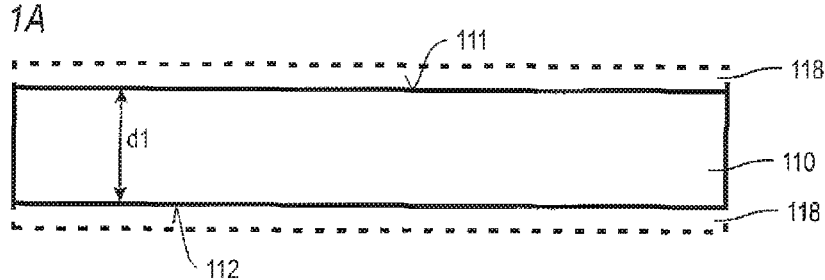

An embodiment is described next with reference to FIGS. 1A to 1G. Furthermore, FIGS. 1B, 1C, 1D and 1F illustrate processes according to an embodiment, while FIGS. 1A, 1E, and 1G illustrates optional processes. FIGS. 7A and 7D describe a more general embodiment which basically corresponds to an embodiment of FIGS. 1B, 1C, 1D and 1F.

A device wafer 110 having a first side 111 and a second side 112 opposite the first side 111 is provided. The device wafer 110 is cut from an ingot formed by a CZ process, which also includes magnetic CZ processes (MCZ processes). The device wafer 110 is made of a semiconductor material.

CZ processes are more cost efficient than FZ processes and allows manufacturing of ingots having a larger diameter. According to an embodiment, the device wafer 110 has a diameter of at least 150 mm (6 inch), particularly of at least 200 mm (8 inch), and even more particularly of at least 250 mm (10 inch) such as 300 mm (12 inch). Larger device wafers 110 allow the integration of more semiconductor devices and thus lead to a reduction of manufacturing costs.

The device wafer 110 can be made of any semiconductor material suitable for manufacturing semiconductor components. Examples of such materials include, without being limited thereto, elementary semiconductor materials such as silicon (SI), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used.

According to an embodiment, the semiconductor material is a group IV semiconductor material such as Si.

According to another embodiment, the semiconductor material is a binary II-VI semiconductor material.

The device wafer 110 typically has an intrinsic resistivity in a given range, which can be between about 20 Ohm*cm to about 240 Ohm*cm. More particularly, the device wafer 110 can have a given intrinsic resistivity with a variation of the intrinsic resistivity of about equal to or less +/−15% or even of about equal to or less +/−8%. Depending on the rated blocking voltage of the final semiconductor device to be integrated in the device wafer 110, the given intrinsic resistivity can be, for example, 30 Ohm*cm, 60 Ohm*cm, 120 Ohm*cm, or 180 Ohm*cm with any of the above mentioned variation ranges. The intrinsic resistivity can be 30 Ohm*cm+/−15%, 60 Ohm*cm+/−8%, 120 Ohm*cm+/−30%, or 180 Ohm*cm+/−15% to give just few specific illustrative examples. Further examples are given further below.

Intrinsic resistivity refers to the resistivity of the semiconductor material of the ingot. The intrinsic resistivity is thus mainly determined by the process for manufacturing the ingot.

The device wafer 110 has a first thickness d1 which is typically larger than the final thickness of the semiconductor device but smaller than a thickness needed to handle the device wafer 110 without any carrier wafer bonded to it. For example, a device wafer having a diameter of 200 mm (8 inch), which is referred to as 200 mm large device wafer, is typically about 725 μm thick to allow handling of the wafer without any additional carrier wafer. The device wafer 110 is typically thinner to avoid wasting too much expensive semiconductor material. The first thickness d1 can be, for example, about 400 μm for a 200 mm large device wafer 110. Typically, the first thickness d1 of the device wafer 110 is about 300 μm to about 850 μm, depending on the final thickness of the semiconductor devices and the size of the device wafer 110.

The device wafer 110 can have an initial interstitial oxygen concentration, which is referred to as initial Oi concentration, of equal to or less than $5*10^{17}/cm^3$, particularly equal to or less than $3*10^{17}/cm^3$.

The Oi concentration of the device wafer 110 can be reduced by the processes as described herein so that device wafers 110 having a larger Oi concentration can also be used which allows usages of device wafers 110 which were otherwise discarded due their high initial Oi concentration.

As illustrated in FIG. 1A, an optional oxide layer 118 can be formed on at least one of the first and second side 111, 112 of the device wafer 110. Typically, the oxide layer 118 can be formed on both sides 111, 112. In a further process, the oxide layer 118 is removed prior to subjecting the device wafer 110 to a first high temperature process.

The optional oxide layer 118 can be formed, for example, by a thermal treatment in an oxidizing atmosphere, for example at a temperature between 1100° C. and 1180° C. for a time period between 2 h and 5 h.

Formation and removal of the optional oxide layer 118 reduces the so-called crystal originated particles, which are abbreviated as COPs. COPs can, for example, degrade gate oxides of the final semiconductor devices. Reducing the concentration of the COPs thus improves the quality of functional layers and reduces, for example, leak currents through gate oxides.

Figure 1B:
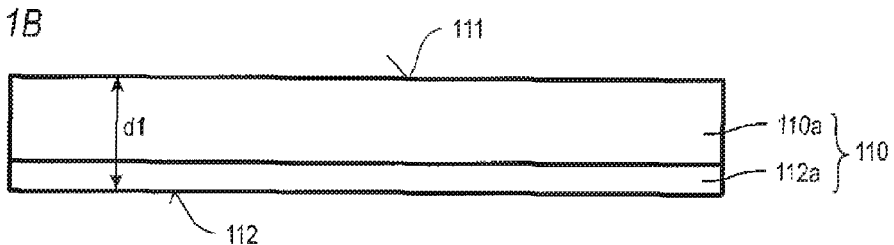

In a process, as illustrated in FIG. 1B, and also in FIG. 7A the device wafer 110 is subjected to a first high temperature process to reduce the oxygen content, i.e. the Oi concentration, of the device wafer 110 at least in a region 112a at the second side 112. The first high temperature process typically reduces the Oi concentration at both sides 111, 112 of the semiconductor wafer 110.

The first high temperature process can be carried out for 1 h to 20 h at a temperature between 1000° C. to 1300° C., typically between 1100° C. to 1200° C., in an inert atmosphere.

Alternatively, the first temperature process can be carried out for 1 h to 20 h at a temperature of equal to or less than 1100° C., for example less than 1050° C., in an oxidizing atmosphere such that the solid solubility limit of interstitial oxygen is much lower than the original oxygen concentration resulting in an effective out diffusion of oxygen.

The first high temperature process results in an out-diffusion of oxygen particularly from regions close to the opposing surfaces of the device wafer 110. The reduction of the Oi concentration at the surfaces can be carried out, depending on the temperature and duration of the first high temperature process, by a factor of about 2 to 5 or even more relative to the initial Oi concentration.

Figure 3:
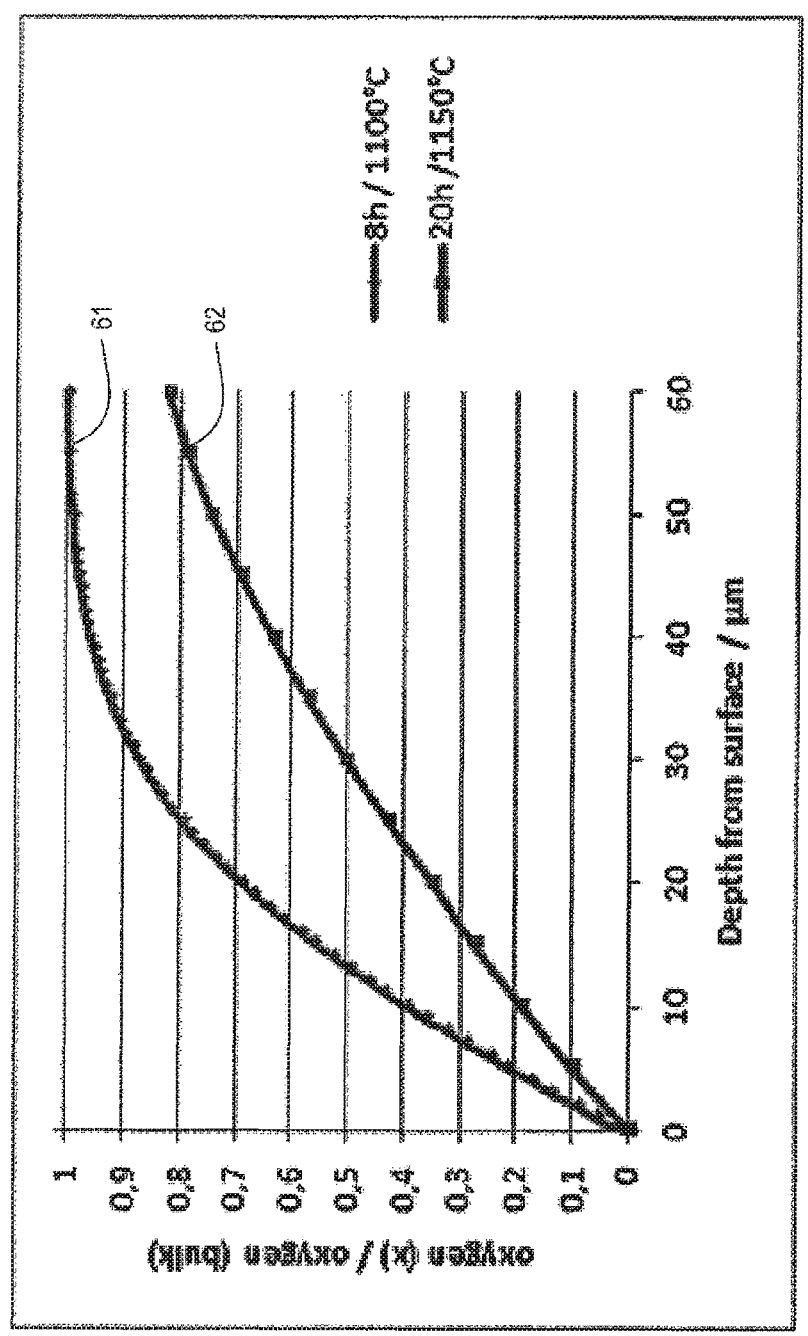
FIG. 3 illustrates the oxygen concentration after thermal processes at different temperature and time.

The reduction of the Oi concentration by the first high temperature process is illustrated in FIG. 3 for two processes of different temperature and duration. Curve 61 illustrates the resulting Oi concentration after a treatment at 1100° C. for 8 h and curve 62 illustrates the resulting Oi concentration for a treatment at 1150° C. for 20 h. Both processes are in inert atmosphere. A reduction of the Oi concentration relative to the initial Oi concentration, which is expressed as bulk concentration, can be achieved in regions closer to the exposed surfaces of the device wafer 110. For example, a region with a reduced Oi concentration of at least 50% extends to a depth of about 30 µm relative to the surface when keeping the device wafer 110 at a temperature of about 1150° C. for 20 h. The longer the time period for the first high temperature process, the deeper extend the region with reduced Oi concentration.

It would be possible to reduce the Oi concentration to less than 50% of the initial Oi concentration even in deeper regions or within the bulk of the device wafer 110. However, a very long first high temperature process would be needed which is economically not feasible. To reduce the Oi concentration also in deeper regions, the approach as described herein is used.

Figure 1C:
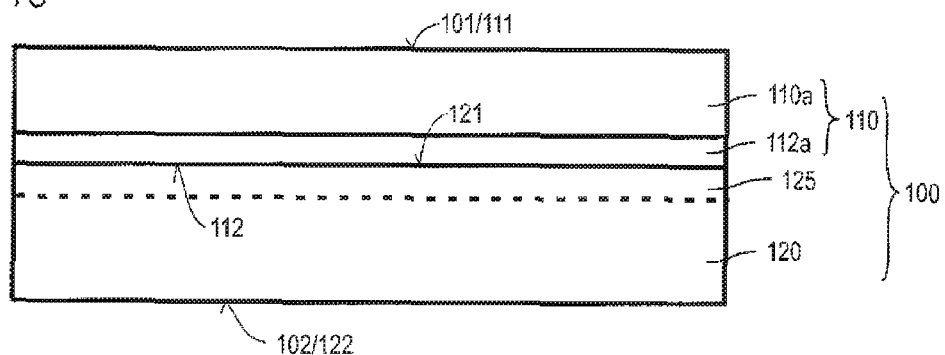

As illustrated in FIG. 1C, and also in FIG. 7B, the second side 112 of the device wafer 110 is bonded to a first side 121 of a carrier wafer 120 to form a substrate wafer 100 which includes the device wafer 110 bonded to the carrier wafer 120. The carrier wafer 120 can be of a semiconductor material and has a second side 122 opposite the first side 121. The second side 122 of the carrier wafer 120 forms the second side 102 of the substrate wafer 100, and the first side 111 of the device wafer 110 forms a first side 101 of the substrate wafer 100. For example, the carrier wafer 120 can be of the same or of a different semiconductor material than the device wafer 110.

The carrier wafer 120 does not need to meet the specifications regarding the intrinsic resistivity and Oi concentration, as the carrier wafer 120 is finally removed and/or does not form part of the electronically active regions of the final device.

For example, the carrier wafer 120 can be from the same ingot from which the device wafer 110 is cut but from a region of the ingot which does not meet the desired specification. Thus, a composite substrate wafer 100 is formed which includes wafers from different regions of the same ingot. According to an embodiment, the carrier wafer 120 is from another ingot than the device wafer 110.

Alternatively, the carrier wafer 120 is made of a non-semiconductor material and can be comprised of an amorphous or partially amorphous material such as a glass material or graphite, or of a polycrystalline material. For protection, for example to protect graphite, the carrier wafer can include an encapsulating layer forming an oxygen barrier.

The first side 121 of the carrier wafer 120 and the second side 112 of the device wafer 110 are typically polished prior to bonding to have flat surfaces for improved bonding quality. The polishing processes can be carried out directly after cutting the wafers 110, 120 or shortly prior to bonding.

According to an embodiment, each of the device wafer 110 and of the carrier wafer 120 has the same diameter such as of at least 150 mm (6 inch) or of at least 200 mm (8 inch).

The carrier wafer 120 can be subjected to a separate high temperature process, which is referred to as third high temperature process, to reduce the oxygen content of the carrier wafer 120 prior to bonding the device wafer 110 to the carrier wafer 120. This is beneficial to reduce the Oi concentration close to the first side 121 of the carrier wafer 120. The third high temperature process can be carried out at the same temperature and duration as the first high temperature process. Alternatively, the third high temperature process can be longer and/or at a higher temperature than the first high temperature process to reduce the Oi concentration even more. The carrier wafer 120 can thus have a lower Oi concentration at its first side 121 than the device wafer 110 has at its second side 112. The carrier wafer 120 can therefore form a "sink" for oxygen so that oxygen diffuses from the device wafer 110 into the carrier wafer 120 during any further thermal process which is beneficial for keeping the Oi concentration within the device wafer 110 low. Alternatively the third high temperature process can be shorter or/and at a lower temperature as the first two high temperature processes.

According to an embodiment, an optional doping region 125 can be formed at the first side 112 of the carrier wafer 110 prior to bonding the device wafer 110 to the carrier wafer 120. The optional doping region 125 can be in direct contact with the region 112a of the device wafer 110 having a reduced Oi concentration. The doping region 125 can be, for example, of p-type and functions as dopant source for out-diffusion into the device wafer 110 for forming a backside emitter region. The optional doping region 125 is not formed in the embodiment shown in FIG. 7B.

According to an embodiment, the doping region 125 can be of n-type. According to another embodiment, the doping region 125 includes p-dopants and n-dopants which can be implanted, for example, at different depth. For example, n-dopants are typically used to form an optional field stop layer within the device waver 110. For example, p-dopants are typically used to form the backside emitter region. The location of these doping regions (n-type field stop layer and p-type backside emitter region) can be controlled through the selections of the respective dopants and the implantation depth in the carrier wafer 120. As p- and n-dopants have different coefficient of diffusion, both diffuse at different rate into the device wafer 110 so that the respective n- and p-doping regions are formed at a different depth in the device wafer 110.

Optionally, the carrier wafer 120 can be provided with a capping layer, for instance nitride, at least at its first side 121 to avoid out-diffusion of oxygen from the carrier wafer 120 into the device wafer 110 if, for example, the carrier wafer 120 was not subjected to the third high temperature process.

Bonding the carrier wafer 120 to the device wafer 110 can be carried out by hydrophilic or hydrophobic processes.

Furthermore, either the first side 121 of the carrier wafer 120 or the second side 112 of the device wafer 110, or both of these sides 121, 112, can be provided with an oxide layer to facilitate bonding. Alternatively, no oxide layers are provided so that exposed semiconductor surfaces of the device wafer 110 and the carrier wafer 120 are bonded with each other.

According to an embodiment, an optional nitride layer can be formed either on the first side 121 of the carrier wafer 120 or on the second side 112 of the device wafer 110, or both of these sides 121, 112.

The thickness of the carrier wafer 120 can be selected such that the thickness of the substrate wafer 100, which includes the device wafer 110 and the carrier wafer 120, is in the typical range of a wafer. The typical range intends to describe that the thickness of the substrate wafer 100 is such that the substrate wafer 100 is mechanically stable enough to be handled without an additional supporting wafer. For example, the thickness of the substrate wafer 100 can be in a range of about 725 µm for a 200 mm large substrate wafer to avoid adaptation of the process equipment which would otherwise be needed due to a different thickness.

The carrier wafer 120 is, according to an embodiment, of the same intrinsic doping type as the device 110 to avoid any contamination of the device wafer 110. As explained above, the carrier wafer 120 can be from the same ingot as the device wafer 110 and does not need to meet the specification regarding resistivity and Oi concentration. Such wafers are typically discarded by the ingot manufacturer. The use of such discarded wafers reduces the total costs for the substrate wafer 100 in comparison to the case where the substrate wafer 100 would be completely formed by a device wafer meeting the specification regarding resistivity and Oi concentration since the device wafer 110 can be much thinner than the substrate wafer 100. An optional oxide and/or nitride layer at the bonding interface avoids any undesired diffusion of dopants from one wafer to the other.

As shown in FIG. 1D, and also in FIG. 7C, the first side 101 of the substrate wafer 100, which is formed by the first side 111 of the device wafer 110, can be processed to reduce the thickness of the device wafer 110 to a second thickness d2 which is less than the first thickness d1 of the device wafer 110. For example, the second thickness d2 of the device wafer 100 is less than 400 µm, for example less than 200 µm or even less than 150 µm, and typically in the range for the final thickness of the semiconductor devices to be integrated into the device wafer 110. The processed first side of the device wafer is indicated at 111p which also forms the processed first side 101p of the substrate wafer 100.

Processing the first side 111 includes, for example, chemical-mechanically polishing, grinding and etching.

According to an embodiment, a laser thermal anneal process using a laser 190 can be carried out after processing the first side 111p to melt the processed first side 111p to a depth of at least 200 nm, typically to a depth between 400 nm and 4 µm. Melting the first side 111p by laser removes crystal defects which may be caused by processing the first side 111.

In a further process, the substrate wafer 100 is subjected to a second high temperature process to reduce the oxygen content at least of the device wafer 110 bonded to the carrier wafer 120.

The second high temperature processes can be carried out at the same process conditions as were used for the first high temperature process, or at different conditions. Typically, both the first and second high temperature processes are carried out for 1 h to 20 h at a temperature between 1000° C. to 1300° C. in an inert atmosphere, or alternatively, for 1 h to 20 h at a temperature of equal to or less than 1100° C. in an oxidizing atmosphere. It is also possible to carry out one of the first and second high temperature processes in an inert atmosphere and the other one of the first and second high temperature processes in an oxidizing atmosphere.

Figure 5:
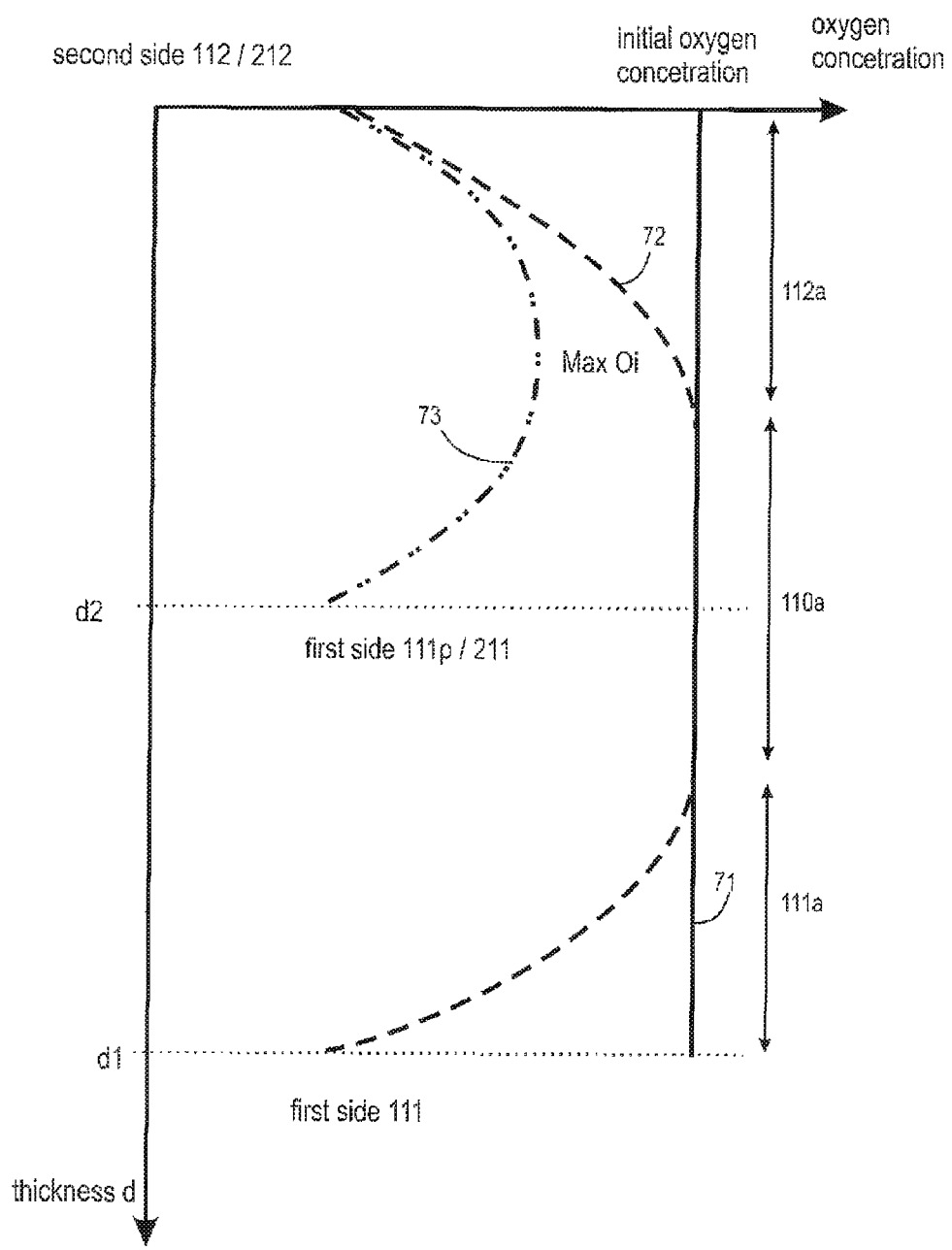
FIG. 5 illustrates the oxygen distribution in the device wafer after different processes according to an embodiment.

With reference to FIG. 5, the effect of the first and second high temperature processes and the intermediate processing step to reduce the thickness of the device wafer 110 on the Oi concentration is explained.

The device wafer 110 has the initial thickness d1. The initial Oi concentration before the first and second high temperature processes is indicated by the straight vertical line 71. The first high temperature process reduces the Oi concentration in regions close to the first and second side 111, 112 of the device wafer 110. The resulting Oi concentration distribution after the first high temperature process is illustrated by the dashed curve 72. The Oi concentration is reduced in regions 111a, 112a which are at the first and the second side 111, 112, respectively, of the device wafer 110. A central region 110a of the device wafer 110 remains at the initial Oi concentration 71. At this stage, the device wafer 110 is not yet bonded to the carrier wafer 120.

After bonding the device wafer 110 to the carrier wafer 120 and processing the first side 111 of the device wafer 110 to thin the device wafer 110 to the thickness d2, a portion of the central region 110a is exposed at the processed side 111p of the device wafer 110. Upon subjecting the thinned device wafer 110 to the second high temperature process, oxygen is diffused out from the processed first side 111p which results in the Oi concentration distribution as illustrated by the dotted-dashed curve 73. Since the second side 112 of the device wafer 110 is bonded to the carrier wafer 120, no oxygen, or only a small proportion of oxygen, diffuses out at the second side of the device wafer 110. In the case of a significant reduced oxygen concentration in the carrier wafer, a significant faster out diffusion of oxygen out of the second side of the device wafer is enabled.

The two high temperature processes with the intermediate thinning process thus results in a significant reduction of the Oi concentration throughout the device wafer 110.

The second high temperature process can also serve for out-diffusing the p-dopants and/or n-dopants from the carrier wafer 120 into the device wafer 110 to form the p-doped backside emitter region and/or the n-doped field stop layer. An additional thermal out-diffusion process is not needed but can be carried out if desired.

The combination of the first and second high temperature processes results in a reduction of the Oi concentration by a factor of at least 2, particularly of at least 5 or even of at least 10. The resulting Oi concentration in thickness direction of the device wafer 110, and therefore also of the final semiconductor devices, has a distribution with a local maximum in a central portion, which local maximum is about at least 2-times, for example 2-times to 5-times, and typically at least 3-times larger than the Oi concentration at the respective surfaces of the device wafer 110 and the semiconductor chip of the final device.

The device wafer 110 and the semiconductor substrate of the final semiconductor device, respectively, can have an Oi concentration along a thickness line of the device wafer or of semiconductor substrate, respectively, which has a global maximum at a position of 20% to 80%, particularly 30% to 70%, more particularly 40% to 60%, of the thickness relative to the first side 111p, wherein the local maximum is at least 2-times larger, particularly at least 5-times larger, than the oxygen concentrations at each of the first side 111p and the second side 112 of the device wafer 110 or of the semiconductor substrate of the final semiconductor device. The thickness line is normal to the main surface or side of the device wafer 110.

The local maximum of the Oi concentration provides a benefit as it allows a local increase of the n-doping concentration using a separate temperature process at a later stage. The separate temperature process can be carried out, for example, for several hours at intermediate temperatures between, for example, 420° C. to 470° C. During this separate temperature process, the oxygen atoms, which form thermal donators, are activated and therefore locally increases the n-doping concentration of the device which is beneficial for the switching behaviour of the final semiconductor device.

According to an embodiment, as illustrated in FIG. 1E, the rim 116 of the device wafer 110 can be optionally processed after reducing the thickness of the device wafer 110. Typically, wafers are provided with rounded edges. When two wafers of the same size are bonded to each other, a circumferential recess is formed by the two wafers. The recess 199 is illustrated in the enlarged portion of FIG. 1E. When one of the wafers, in the present case the device wafer 110, is thinned, a sharp rim 116 is formed with a sharp circumferential upper edge 119 as best shown in the enlarged portion of FIG. 1E. As this sharp rim 116 could easily break and thus could be a source for cracks extending into the centre of the device wafer 110, the rim 116 is ground to form a round rim 117 as illustrated in the enlarged portion of FIG. 1E.

According to an embodiment, a carrier wafer 120 having a larger diameter than the device wafer 110 can be alternatively used so that the larger carrier wafer 120 laterally projects the device wafer 110 and thus protects the rim 116 of the device wafer 110.

Figure 1F:
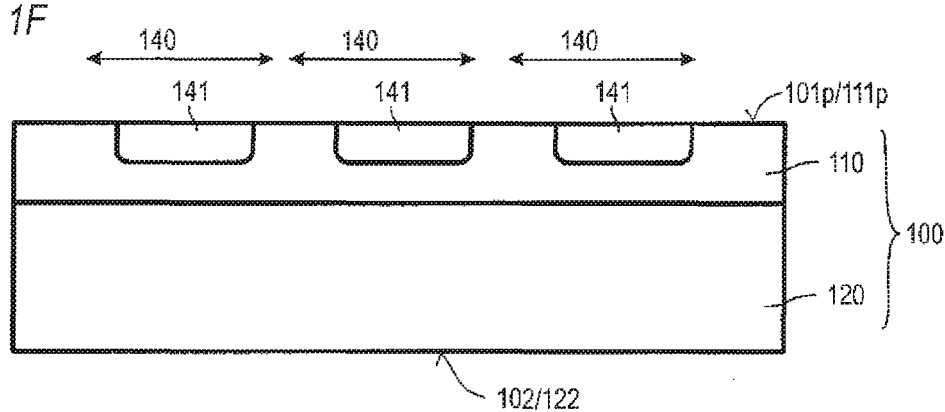
Figure 1G:
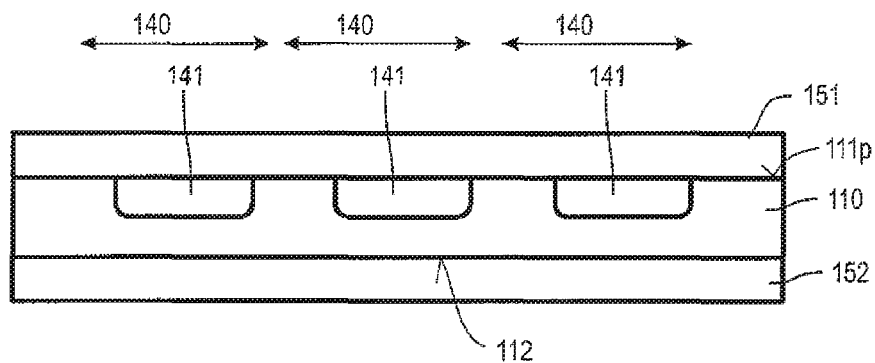

In a further process, as illustrated in FIG. 1F, and also in FIG. 7D, at least one semiconductor component 140, typically a plurality of semiconductor components 140, is at least partially integrated into the device wafer 110 after the second high temperature process. This is illustrated by the respective doping regions 141 of the semiconductor components 140. A skilled person will appreciate that each semiconductor component 140 can include more than one doping region, typically at least two doping regions of different conductivity type to form at least one pn-junction.

According to an embodiment, as illustrated in FIG. 1G, the carrier wafer 120 is removed completely or at least partially after partially or completely integrating the semiconductor component 140. Finally, a front metallization 151 and a back metallization 152 are formed on the processed first side 111p and the second side 112 of the device wafer 110. The front metallization 151 and the back metallization 152 are in ohmic contact with the respective doping regions of the semiconductor devices 140.

With respect to FIGS. 2A to 2J a further embodiment is described. To avoid repetition, reference is made to the embodiment of FIGS. 1A to 1G for processes which are similar to processes of the FIGS. 1A to 1G.

As illustrated in FIG. 2A, a device wafer 110 with a first side 111 and a second side 112 is provided as described above. The device wafer 110 has an initial Oi concentration. The thickness d1 of the device wafer 110 is in the above given range and is particularly thinner than needed for securely handling the device wafer 110.

FIG. 2B illustrates the first high temperature process which forms regions 111a and 112a with reduced Oi concentration at the first and second side 111, 112, respectively. Different thereto, a central region 110a of the device wafer 110 remains at the initial Oi concentration.

According to an embodiment, as illustrated in FIG. 2C, at least one of an epitaxial layer 113 and a doped region 113 is optionally formed on the second side 112 of the device wafer 110 prior to bonding the device wafer 110 to the carrier wafer 120. The epitaxial layer or doping region 113 can form a backside emitter region or a field stop layer. Furthermore, both a backside emitter and a field stop layer can be formed. The depth of the field stop layer and/or the backside emitter can be adjusted by controlling the implantation depth and by appropriately selecting the dopants having a given diffusion rate.

Optionally, a layer containing dopants such as phosphor can be deposited on the second surface 112. This dopant layer acts as a source for dopants which diffuses into the device wafer 110 during any of the subsequent thermal processes. For example, a backside emitter can be formed using the dopant layer. The dopant layer can be removed at a later stage, for example prior to bonding.

According to an embodiment, as illustrated in FIG. 2D, an optional oxygen barrier 114 is formed on at least one of the second side 112 of the device wafer 110 and the first side 121 of the carrier wafer 120 prior to bonding the device wafer 110 to the carrier wafer 120. The oxygen barrier 114 can be, for example, a nitride layer. Additionally, an optional oxide layer can be formed, for example by CVD or thermal processes. The thermal processes should be carried out at temperatures at which the maximum saturation of oxygen is as low as possible to avoid that oxygen diffuses back into the device wafer 110 at later process steps. Typically, the temperature for the thermal processes is at least 400° C., particularly at least 700° C. Typically, the temperature is less than 1100° C.

The oxygen barrier 114 can have a thickness of about 500 nm to about 300 nm, typically of about 100 nm.

Parallel to the above processes, a carrier wafer 120 is provided having a first and a second side 121, 122 as illustrated in FIG. 2E. The carrier wafer 120 does not need to meet the specification as desired for the device wafer 110. The carrier wafer 120 is made of a semiconductor material as described above, typically of the same semiconductor material as the device wafer 110.

FIG. 2F illustrates a third high temperature process to reduce the oxygen content, i.e. the 01 concentration, of the carrier wafer 120 prior to bonding the device wafer 110 to the carrier wafer 120 as described above. The third high temperature process forms regions 121a, 122a with reduced Oi concentration at the first and second side 121, 122 of the carrier wafer 120.

Furthermore, the first side 121 of the carrier wafer 120 can be provided with a doping layer. Moreover an oxide layer, which forms a bond oxide, can be formed on the first side 121 of the carrier wafer 120 or on the second side 112 of the carrier wafer 110.

Figure 2G:
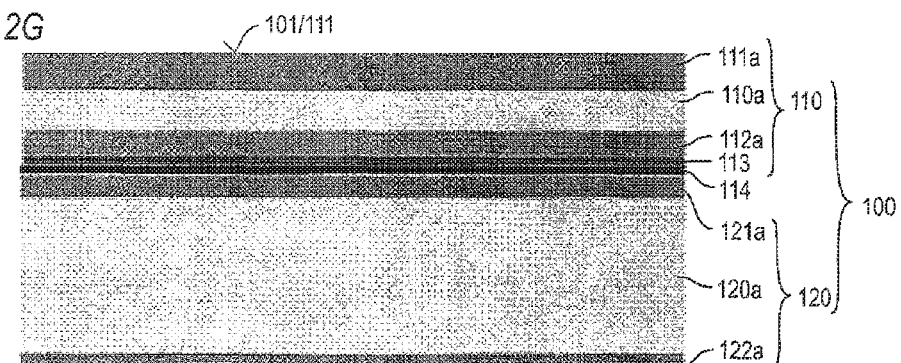

As illustrated in FIG. 2G, the second side 112 of the device wafer 110 is bonded to the first side 121 of a carrier wafer 120 to form a substrate wafer 100. The substrate wafer 100 thus includes the device wafer 110 bonded to the carrier wafer 120. The second side 122 of the carrier wafer 120 forms the second side 102 of the substrate wafer 100, and the first side 111 of the device wafer 110 forms the first side 101 of the substrate wafer 100.

Figure 2H:
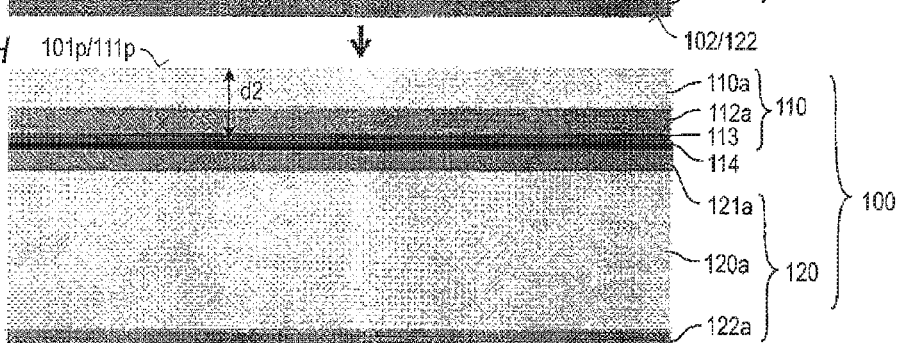
Figure 2I:
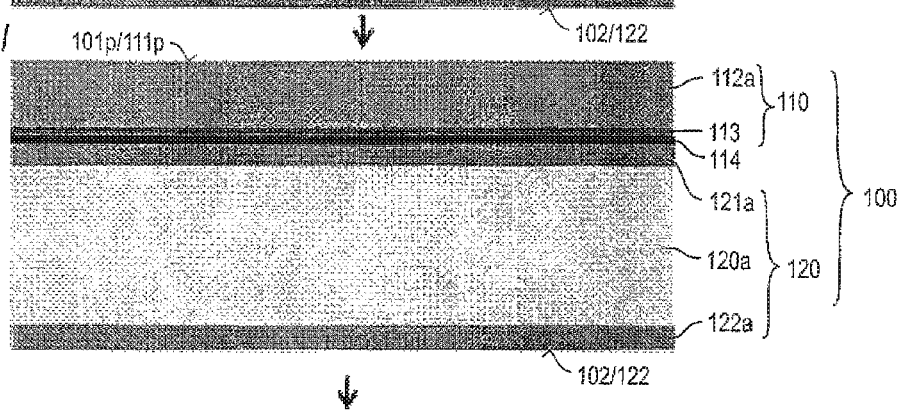

In a further process, as illustrated in FIG. 2H, the first side 101 of the substrate wafer 100, which is formed by the first side 111 of the device wafer 110, is processed, for example ground or polished, to reduce the thickness of the device wafer 110 to a second thickness d2 which is less than the first thickness d1 of the device wafer. This is described in detail further above.

A melting laser thermal anneal process can be employed to remove crystal defects after thinning as described above. The final thickness d2 of the device wafer 110 is typically less than 400 μm, particularly less than 200 μm or less than 150 μm.

Figure 2J:

In a further process, as illustrated in FIG. 2J, the substrate wafer 100 is subjected to a second high temperature process to reducing the oxygen content at least of the device wafer 110. As a result, the device wafer 110 is completely formed by a region 112a having a reduced Oi concentration as described in detail in connection with FIGS. 3 and 5.

In a further process, as illustrated in FIG. 2J, semiconductor devices are integrated into the device wafer 110, which remains bonded to the carrier wafer 120 during these processes.

In addition to that, the carrier wafer 120 is removed, for example by etching or by CMP processes using the oxygen barrier 114, for example the nitride layer, or the bond oxide as etch stop.

Using the oxygen barrier 114 and/or the bond oxide as etch stop reduces the thickness variation of the final semiconductor devices. Furthermore, as both the thinning process of FIG. 2H and the removal process of FIG. 2J are carried out when typically no additional layers such as structured field oxide layers or metallization layers are formed on the device wafer 110, the device wafer 110 has flat surfaces which is beneficial for an even thickness reduction. The final semiconductor devices can therefore have a significantly reduced thickness variation.

The processes described herein also allow the formation of the backside emitter and/or the field stop layer at an early stage of the manufacturing process. Formation processes for the backside emitter and/or the field stop layer are usually carried out after the backside of a wafer is finally polished down to the final thickness, i.e. when the wafer is thin. As thin wafers are prone to breakage, formation of the backside emitter and/or the field stop layer at a stage where the device wafer 110 has a thickness d1 larger than the final thickness d2, the number of so-called "thin wafer processes" can be reduced and the production efficiency, due to the reduced likelihood of breakage, can be increased.

According to an embodiment, the oxygen barrier 114 and/or the bond oxide can be used as a mask after removal of the carrier wafer 120, for example after photolithographic structuring of the oxygen barrier 114 and/or the bond oxide.

Furthermore, the oxygen barrier 114 and/or the bond oxide can be optionally used as protective layer during further processes to protect the second side 112 of the device wafer 110, for example against mechanical impacts such as scratches and/or against contamination. The oxygen barrier 114 and/or the bond oxide can then be removed at a later stage, for example prior to forming the back metallization.

In addition to that, the backside emitter can be formed by using a doping layer formed on the first side 121 of the carrier wafer 120 from which dopants diffuses into the device wafer 110 during processing.

According to an embodiment, a getter layer can be formed on the first side 121 of the carrier wafer 120. The getter layer remains during processing, at least until the carrier wafer 120 is removed. The getter layer is beneficial for gettering metallic impurities which may be present in the device wafer 110. The getter layer can be formed, for example, close to the first side 121 of the carrier wafer 120 to improve the gettering efficiency. Additionally, or alternatively, the getter layer can also be formed on the substrate wafer 100, for example on the second side 102 of the substrate wafer 100.

Optionally or additionally, the getter layer can also be formed on the device wafer 110.

Figure 6A:
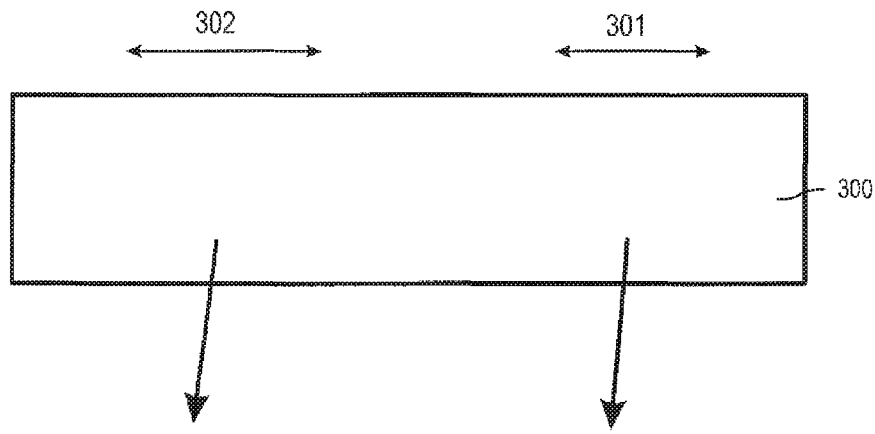
FIGS. 6A to 6C illustrate processes of a method for manufacturing a substrate wafer according to an embodiment.
Figure 6B:
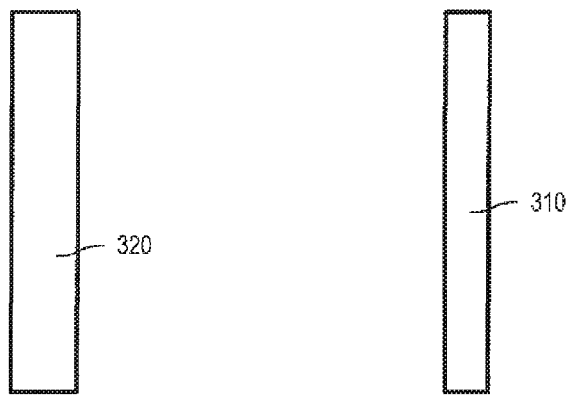
Figure 6C:
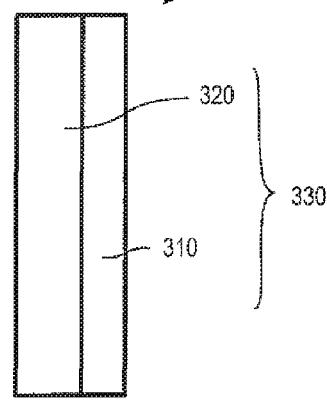

With reference to FIGS. 6A to 6C a further embodiment is described.

FIG. 6A illustrates a monocrystalline ingot 300 of a semiconductor material which is typically a CZ ingot or an MCZ ingot. In a further process, the oxygen concentration distribution of the ingot 300, or of different ingots 300, is determined. In addition to that or alternatively, the resistivity distribution of the one or more monocrystalline ingots 300 is determined. This determination results in the identification of regions 301, 302 of different Oi concentration and/or regions of different intrinsic resistivity. In the following, the embodiment is described relative to the Oi concentration. A skilled person will appreciate that the embodiment can also be carried out based on the determination of the intrinsic resistivity.

In a further process, at least a first region 301 of the one or more monocrystalline ingots 300 which has an oxygen concentration below a given oxygen threshold (or has a resistivity within a given resistivity range) is selected. Furthermore, at least a second region 302 of the one or more monocrystalline ingots 300 which has an oxygen concentration above the given oxygen threshold (or has a resistivity outside a given resistivity range) is selected.

According to an embodiment, the oxygen threshold for the Oi concentration is $5*10^{17}/cm^3$, particularly equal to or less than $3*10^{17}/cm^3$.

According to an embodiment, the given resistivity range is between 20 Ohm*cm to 240 Ohm*cm. For example, the given resistivity range can be 30 Ohm*cm+/−30%, or 30 Ohm*cm+/−15%, or 30 Ohm*cm+/−8%, or 60 Ohm*cm+/−

30%, or 60 Ohm*cm+/−15%, or 60 Ohm*cm+/−8%, or 120 Ohm*cm+/−30%, or 120 Ohm*cm+/−15%, or 120 Ohm*cm+/−8%, or 180 Ohm*cm+/−30%, or 180 Ohm*cm+/−15%, or 180 Ohm*cm+/−8%. When referring to a given resistivity range, the local resistivity can exhibit a distribution of the resistivity values. The above given examples indicates the resistivity distribution by its centre value (arithmetic mean) and its total range (maximum value to minimum value), for example 30 Ohm*cm+/−15%.

In further processes, as illustrated in FIG. 6B, the first region 301 and the second region 302 are sliced to form at least a first semiconductor wafer 310 and a second semiconductor wafer 320. The first and second semiconductor wafers 310, 320 can have the same thickness or can be of different thickness. FIG. 6B illustrates an embodiment where the first semiconductor wafer 310 is thinner than the second semiconductor wafer 320.

According to an embodiment, the Oi concentration of the first semiconductor wafer 310 can be below the oxygen threshold, and the Oi concentration of the second semiconductor wafer 320 can be above the oxygen threshold. According to an embodiment, the Oi concentration of the first semiconductor wafer 310 is lower than the Oi concentration of the second semiconductor wafer 320 by at least 5%, particularly by at least 10%, and more particularly by at least 20%, relative to the Oi concentration of the second semiconductor wafer 320.

According to an embodiment, the first region 301 and the second region 302 of the one or more monocrystalline ingots 300 are sliced such to provide the first semiconductor wafer 310 with a thickness which is less than a thickness of the second semiconductor wafer 320. The first semiconductor wafer 310 typically forms the device wafer 110 as it meets the desired specification for manufacturing semiconductor devices such as power devices. The second semiconductor wafer 320 typically forms the carrier wafer 120.

The first and second semiconductor wafers 310, 320 differ from each other at least in their Oi concentration and/or their intrinsic resistivity.

The first and second semiconductor wafers 310, 320 are bonded to each other as illustrated in FIG. 6C to form a substrate wafer 330 as described above.

This approach efficiently uses the material of the ingot 300 since also portions of the ingot having properties outside of the desired ranges are employed. This significantly increases the yield and thus reduces the manufacturing costs and allows the usage of CZ or MCZ ingots for the manufacturing of semiconductor devices which has high demands regarding the initial electrical and chemical properties of the starting wafer material.

The above processes allow manufacturing of semiconductor devices with superior electrical characteristics. The semiconductor devices show a specific Oi concentration distribution as illustrated in and explained in connection with FIG. 5. The Oi concentration distribution can be, for example, verified by suitable detecting methods such as SIMS or infrared spectroscopy.

Particularly power semiconductor devices such as bipolar devices, for example diodes and IGBTs, benefit from the above manufacturing processes. Furthermore, unipolar devices, for example Power-MOSFETs, also benefit from the above manufacturing processes.

The manufacturing processes employ semiconductor material grown from molten material held in a crucible such as CZ or MCZ processes. The semiconductor material is subjected to at least one, typically two oxygen out-diffusion processes to reduce the Oi concentration below a critical threshold for the formation of thermal donators. The semiconductor material (semiconductor wafer) is thinned between the two oxygen out-diffusion processes. Optionally, one or more epitaxial layers and/or one or more doping regions can be formed.

A significant benefit provided by the manufacturing processes is that the device wafers 110 can be thinner since the device wafers 110 are supported by carrier wafers 120 which do not need to have the desired characteristics. Therefore, the semiconductor material of the ingot is more efficiently used and the number of suitable device wafers, which fulfil the specific characteristics regarding Oi concentration or intrinsic resistivity and which can be obtained from one ingot, is increased. This increases the yield per ingot.

Figure 4:
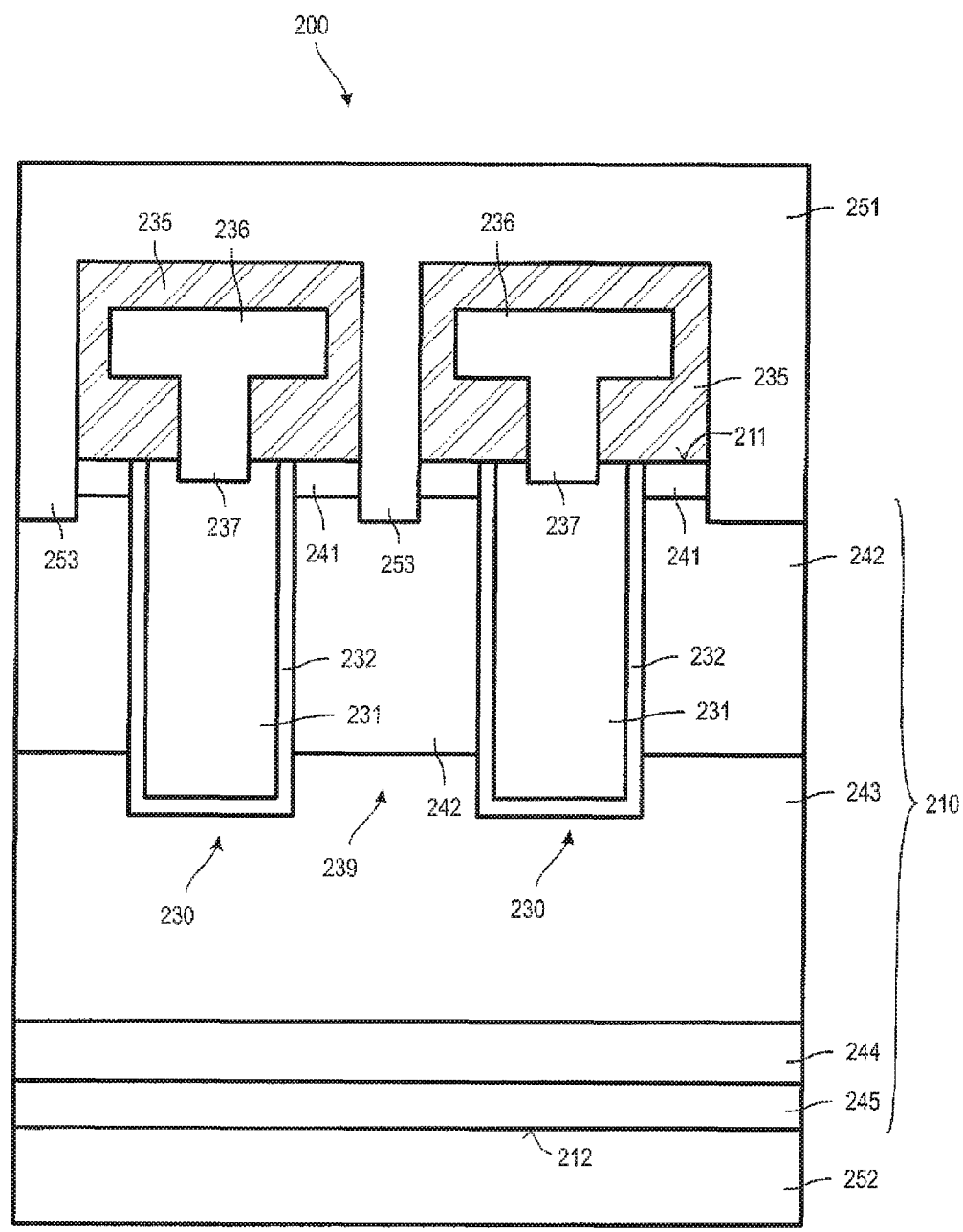
FIG. 4 illustrates a semiconductor device according to an embodiment.

The semiconductor device 200 as illustrated in FIG. 4 is a bipolar power semiconductor device and includes an IGBT without being limited thereto. Alternative bipolar devices are, for example, diodes. Furthermore, the semiconductor device 200 can also be an unipolar power semiconductor device, for example a Power-MOSFET.

The semiconductor device 200 typically includes a plurality field-effect structures each forming a respective transistor cell of the IGBT. The field-effect structures together form a three-terminal device having separate terminals for the gate, source and emitter.

The semiconductor device 200, which is an IGBT in the present embodiment without being limited thereto, includes a semiconductor substrate 210, particularly a monocrystalline silicon substrate, having a first side 211, a second side 212 opposite the first side 211, and a thickness d2. At least one semiconductor component is integrated in the semiconductor substrate 210.

The semiconductor device 200 is a three-terminal power bipolar semiconductor device. The semiconductor device 200 can also be a two-terminal power bipolar semiconductor device such as a diode. These devices are typically vertical components having at least one electrode formed by a first or front metallization 251 at the first side 211 of the semiconductor substrate 210 (source metallization for example), and at least a second or back metallization 252 (emitter metallization for example) at the second side 212 of the semiconductor substrate 210.

The semiconductor device 200 further includes gate electrodes 231 arranged in trenches 230 which are formed in the semiconductor substrate 210. Gate dielectrics 232 electrically insulate the gate electrodes 231 from the semiconductor substrate 210. A mesa region 239 is formed between adjacent trenches 230. The semiconductor device further includes a first doping region (n-doped source region) 241, a second doping region (p-doped body region) 242, a third doping region (weakly n-doped drift region 243), a fourth doping region (n-doped field stop region) 244, and a fifth doping region (p-doped emitter region) 245. In case of a Power-MOSFET, the fifth doping region 245 is an n-doped drain region.

The semiconductor substrate 210 has an oxygen concentration along a thickness line (which would be a vertical line in FIG. 4) of the semiconductor substrate 210 which has a global maximum at a position of 20% to 80% of the thickness of the semiconductor substrate 210 relative to the first side 211. The global maximum is at least 2-times larger, particularly at least 5-times larger, than the oxygen concentrations at each of the first side 211 and the second side 212 of the semiconductor substrate 210 as described, for example, in connection with FIG. 5.

The global maximum of the oxygen concentration can be, for example, less than $5*10^{17}/cm^3$, particularly equal to or less than $3*10^{17}/cm^3$.

The semiconductor device 200 further includes a gate poly 236 and a plurality of gate contacts 237 in ohmic connection with the gate electrodes 231. The gate poly 236 and the gate contacts 237 are electrically insulated from the first or front metallization by an insulation layer 235. The insulation layer 235 includes openings for source contacts 253 which electrically connect the first metallization 251 with the source regions 241.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. With the above range of variations and applications in mind, it should be understood that the present invention is not limited by the foregoing description, nor is it limited by the accompanying drawings. Instead, the present invention is limited only by the following claims and their legal equivalents.

REFERENCE LIST

61/62 oxygen concentration
71 initial Oi concentration
72 Oi concentration after the first high temperature process
73 initial Oi concentration after the second high temperature process
100 substrate wafer
101 first side of substrate wafer
101p processed first side of substrate wafer
102 second side of substrate wafer
110 device wafer
110a region with initial Oi concentration
111a/112a region with reduced Oi concentration
111 first side of device wafer
111p processed first side of device wafer
112 second side of device wafer
113 epitaxial region/doping region
114 barrier layer/nitride layer
116 sharp rim
117 rounded rim
118 optional oxygen layer
119 circumferential upper edge
120 carrier wafer
120a unoxidized region
121a/122a oxide layer/region with reduced Oi concentration
121 first side of carrier wafer
122 second side of carrier wafer
125 p-doped region
140 semiconductor component
141 doping region
151 front metallization
152 back metallization
190 laser
199 recess
200 semiconductor device
210 device wafer/semiconductor substrate
211 first side of device wafer/semiconductor substrate
212 second side of device wafer/semiconductor substrate
230 trench
231 gate electrode
232 gate dielectric
235 insulation layer
236 gate poly
237 gate contact
239 mesa
241 first doping region/source region
242 second doping region/body region
243 third doping region/drift region
244 fourth doping region/field stop region
245 fifth doping region/emitter region
251 front metallization/source metallization
252 back metallization/emitter metallization
253 source contact
300 monocrystalline ingot
301 first region
302 second region
310 first semiconductor wafer/device wafer
320 second semiconductor wafer/carrier wafer
330 substrate wafer

The invention claimed is:

1. A semiconductor device, comprising:
a semiconductor substrate having a first side, a second side opposite the first side, and a thickness;
at least one semiconductor component integrated in the semiconductor substrate;
a first metallization at the first side of the semiconductor substrate;
a second metallization at the second side of the semiconductor substrate;
wherein the semiconductor substrate has an oxygen concentration along a thickness line of the semiconductor substrate which has a global maximum at a position of 20% to 80% of the thickness relative to the first side,
wherein the global maximum is at least 2-times larger than the oxygen concentrations at each of the first side and the second side of the semiconductor substrate.

2. The semiconductor device of claim 1, wherein the global maximum is at least 5-times larger than the oxygen concentrations at each of the first side and the second side of the semiconductor substrate.

3. The semiconductor device of claim 1, wherein the global maximum of the oxygen concentration is less than $5*10^{17}/cm^3$.

4. The semiconductor device of claim 1, wherein the global maximum of the oxygen concentration is equal to or less than $3*10^{17}/cm^3$.

5. The semiconductor device of claim 1, wherein the semiconductor device is a bipolar device.

6. The semiconductor device of claim 1, wherein the semiconductor device is a MOSFET.

7. The semiconductor device of claim 1, wherein the thickness of the monocrystalline silicon substrate is less than 400 μm.

8. The semiconductor device of claim 1, wherein the semiconductor substrate is a monocrystalline silicon substrate.

9. The semiconductor device of claim 1, wherein the semiconductor device is a bipolar power semiconductor device and includes an IGBT.

10. The semiconductor device of claim 9, wherein the semiconductor device comprises a plurality of field-effect structures each forming a respective transistor cell of the IGBT.

11. The semiconductor device of claim 1, wherein the semiconductor device is a bipolar power semiconductor device and includes a diode.

12. The semiconductor device of claim 1, wherein the semiconductor device is a unipolar power semiconductor device and includes a power MOSFET.

13. The semiconductor device of claim 1, wherein the semiconductor device is a three-terminal power semiconductor device.

14. The semiconductor device of claim 1, wherein the semiconductor device is a two-terminal power semiconductor device.

15. The semiconductor device of claim 1, further comprising:
gate electrodes arranged in trenches formed in the semiconductor substrate;
gate dielectrics electrically insulating the gate electrodes from the semiconductor substrate; and
mesa regions formed between the trenches.

16. The semiconductor device of claim 15, further comprising:
a source region of a first conductivity type arranged in the mesa regions at the first side of the semiconductor substrate;
a body region of a second conductivity type arranged in the mesa regions below the source region;
a drift region of the first conductivity type arranged below the body region;
a drain region of the first conductivity type or an emitter region of the second conductivity type arranged below the drift region.

17. The semiconductor device of claim 16, further comprising:
a field stop region of the first conductivity type arranged between the drift region and the drain region or the emitter region.

18. The semiconductor device of claim 17, wherein the oxygen concentration in the field stop region is lower than in the drift region.

19. The semiconductor device of claim 16, wherein the oxygen concentration in the source region is lower than in the drift region.

20. The semiconductor device of claim 16, wherein the oxygen concentration in the drain region or the emitter region is lower than in the drift region.

* * * * *

UNITED STATES PATENT AND TRADEMARK OFFICE
CERTIFICATE OF CORRECTION

PATENT NO. : 10,014,400 B2
APPLICATION NO. : 15/650504
DATED : July 3, 2018
INVENTOR(S) : H. Oefner et al.

Page 1 of 1

It is certified that error appears in the above-identified patent and that said Letters Patent is hereby corrected as shown below:

In the Drawings

Figure 5, please change "initial oxygen concetration" to --initial oxygen concentration--.

Figure 5, please change "oxygen concetration" to --oxygen concentration--.

Signed and Sealed this
Fourth Day of September, 2018

Andrei Iancu
*Director of the United States Patent and Trademark Office*